Figure 1:
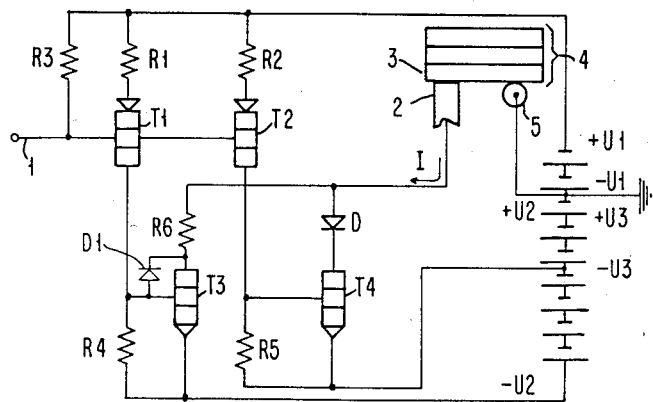

United States Patent [19]
Goldrian et al.

[11] Patent Number: 4,575,740
[45] Date of Patent: Mar. 11, 1986

[54] TRANSISTOR CIRCUIT FOR REDUCING CURRENT AFTER IGNITION IN A METAL PAPER PRINTER

[75] Inventors: Gottfried Goldrian, Boeblingen; Volker Rudolph, Aidlingen, both of Fed. Rep. of Germany

[73] Assignee: International Business Machines Corporation, Armonk, N.Y.

[21] Appl. No.: 477,559

[22] Filed: Mar. 21, 1983

[30] Foreign Application Priority Data

Mar. 25, 1982 [EP] European Pat. Off. ........ 82102519.4

[51] Int. Cl.$^4$ ............................................ G01D 15/08
[52] U.S. Cl. .................................. 346/163; 346/154; 307/131; 307/154; 307/268; 307/270
[58] Field of Search ........................ 346/154, 162–164; 307/131, 135, 154, 260, 270, 52, 254, 261, 268; 358/297–299; 219/121 R, 121 EC, 121 PW, 130.1, 130.32, 130.33, 130.4, 130.5; 204/2

[56] References Cited

U.S. PATENT DOCUMENTS

| | | | |
|---|---|---|---|
| 3,396,314 | 8/1968 | Corson | 317/148.5 |
| 3,631,509 | 12/1971 | Marshall | 346/154 |
| 3,633,051 | 1/1972 | Press et al. | 307/254 X |
| 3,678,291 | 7/1972 | Coe | 307/254 X |
| 3,751,627 | 8/1973 | Prischi | 219/130.4 |
| 3,774,007 | 11/1973 | Chiasson et al. | 219/130.4 |
| 3,787,738 | 1/1974 | Horwath | 307/268 |
| 3,846,801 | 11/1974 | DuMont | 346/165 |
| 3,946,403 | 3/1976 | Ikeuchi et al. | 346/154 |
| 3,986,131 | 10/1976 | Ross et al. | 330/273 |
| 4,013,904 | 3/1977 | Chick | 307/270 X |
| 4,035,670 | 7/1977 | Roman | 307/300 |
| 4,395,715 | 7/1983 | Bahr et al. | 346/1.1 |

FOREIGN PATENT DOCUMENTS

| | | |
|---|---|---|
| 1548595 | 12/1970 | Fed. Rep. of Germany . |
| 2423258 | 5/1976 | Fed. Rep. of Germany . |
| 2916105 | 8/1980 | Fed. Rep. of Germany . |
| 2319433 | 2/1977 | France . |

OTHER PUBLICATIONS

Electrotechnik, Band 63, Nr. 17, Sep. 1981, Seite 66, Wurzburg, DE. "Treiber fur Magnete und Schutze".
Electrotechnik, Band 61, Nr. 20, Oct. 1979, Seiten 24–26 und 28, Wurzburg, DE. "Einfach und betriebssicher".

Primary Examiner—E. A. Goldberg
Assistant Examiner—Fred L. Kampe
Attorney, Agent, or Firm—K. A. Seaman; E. R. Coffman

[57] ABSTRACT

To obtain a good print quality in metal paper printers, the print current, after ignition of the arc, must be rapidly reduced to a fraction of the value necessary for ignition. For this purpose, two transistor power stages (T3, T4) are connected to the print electrode (2). Their partial currents form the print current, whose rapid reduction after ignition of the arc is obtained by the two transistor power stages being operated at voltages (U2, U3) of different magnitude. The second transistor stage (T4) is operated at a voltage (U3), whose magnitude corresponds to the drop in potential occurring upon ignition between the grounded metal layer (3) of the record carrier (4) and the print electrode. As a result, the second transistor stage is switched off when a diode (D) connected to it becomes non-conductive.

2 Claims, 2 Drawing Figures

TRANSISTOR CIRCUIT FOR REDUCING CURRENT AFTER IGNITION IN A METAL PAPER PRINTER

The invention concerns a transistor circuit for switching the print current in a metal paper printer and for automatically reducing the print current after ignition of the arc.

As is known, information in metal paper printers is recorded by an arc being ignited between a print electrode, and a thin metal layer of a record carrier, and on which the electrode rests. The arc causes the metal layer to be burnt out at the position of the print electrode. For igniting the arc, a rapidly rising current is required initially. However, after ignition, this current must be reduced as rapidly as possible to a fraction of the value necessary for ignition, in order to prevent the metal layer from being unduly burnt out, and causing poor print quality.

In U.S. Pat. No. 4,395,715 to Bahr et al., corresponding to European patent application No. 80 105 659, method and arrangements are described for controlling the print current in metal paper printers. The drop in potential, occuring at the print electrode when the arc is ignited, is sensed and used to reduce the print current. For this purpose, the drop in potential influences, through several semiconductor circuit elements, the control input of an emitter follower designed as a Darlington circuit and passed by the print current flow. In addition to the delays which inevitably occur when the print current is reduced by the semiconductor circuit elements influencing the control input of the emitter follower, the known circuit necessitates at the input of the emitter follower a capacity for suppressing the circuit's tendency to oscillate. This capacity together with the collector resistance of a transistor stage supplying the control current for the emitter follower forms an RC element. Thus, after ignition of the arc, the print current can be reduced to a fraction of its original value only after the RC element has been discharged to a lower control voltage. This additionally delays the reduction of the print current. Therefore, in the known arrangement, recording is effected at a higher than minimum power, which adversely affects the print quality.

This is to be remedied by the invention. The invention, as described in a specific embodiment and as characterized in the claims, solves this problem by providing a circuit for automatically reducing the print current in metal paper printers after ignition of the arc, thus permitting use of the minimum power for printing.

The advantage obtained by the invention is a noticeably improved print quality.

Figure 2:
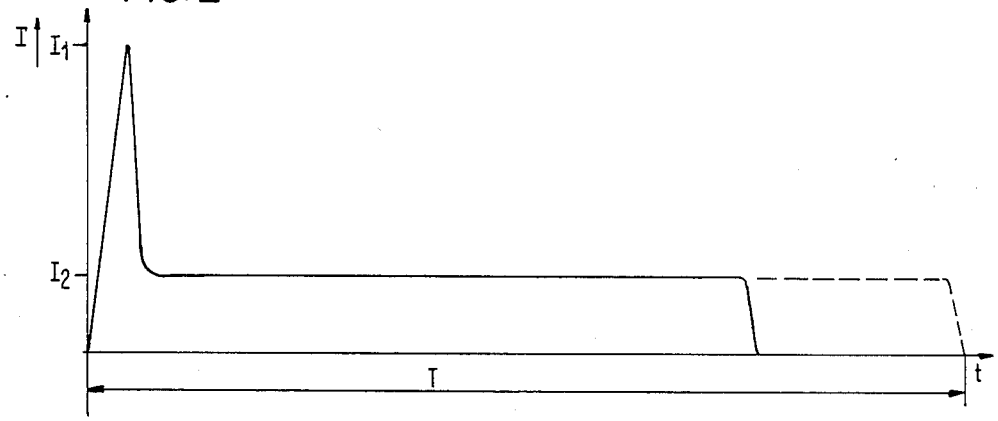

The invention will be described in detail below with reference to drawings of a specific embodiment of the invention in which FIG. 1 is a basic circuit diagram of a transistor circuit according to the invention;

FIG. 2 is a time curve of the current flowing through the print electrode in the maximum time T available for printing.

The circuit according to FIG. 1 comprises the two NPN power transistors T3 and T4 switching the print current, as well as two constant current sources which are formed by the two PNP transistors T1 and T2 and supply the base currents for transistors T3 and T4. The base electrodes of transistors T1 and T2 are connected to each other and to the input 1 of the circuit. Through resistor R3, they are connected to the positive pole of a first operating voltage source U1 of, for example, 5 V, whose negative pole is connected to ground. Through resistors R1 and R2, determining the magnitude of the constant currents, the emitters of transistors T1 and T2 are also connected to the positive pole of the first operating voltage source U1. The collector of transistor T1 is connected to the base of transistor T3 and the collector of transistor T2 is connected to the base of transistor T4. Through resistor R4, the base of transistor T3 is connected to the negative pole of a second operating voltage source U2 of, for example, 48 V, to which its emitter is also connected. The collector of this transistor is connected, through resistor R6, to the print electrode 2 resting on the metal layer 3 of the record carrier 4. By means of a contact roller 5, the metal layer 3 of the record carrier 4 is connected to the ground of the second operating voltage source. The collector of transistor T4 is connected to the print electrode 2 through diode D biased in the forward direction. Through resistor R5, the base of transistor T4 is connected to the negative pole of a third operating voltage source U3 of, for example, 18 V. This third operating voltage source is obtained by tapping the second operating voltage source with which it has the positive pole in common. The emitter of transistor T4 is also connected to the negative pole.

The circuit according to FIG. 1 operates as follows:

In the switched off state, a positive voltage of, for example, 5 V, is applied to input 1 of the circuit. This voltage prevents base current from flowing across resistor R3, as its two terminals are connected to the same potential. Therefore, transistors T1 and T2, and thus transistors T3 and T4, are non-conductive. For printing, the print circuit, formed by the positive poles of the two operating voltage sources U2 and U3, which are connected to the reference potential, as well as by the contact roller 5, the metal layer 3 of the record carrier 4, the print electrode 2 resting thereon, the two transistors T3 and T4 connected to print electrode 2, and the negative poles of the two operating voltage sources, must be closed. For this purpose, the potential of input 1 is lowered for a time T corresponding to the maximum duration of the write or print process, so that the two transistors T1 and T2, and thus transistors T3 and T4, become conductive and the print circuit is closed. The print current flowing at that stage consists of the partial currents passing transistors T3 and T4. As there is no ohmic resistance in the circuit of transistor T4, the partial current flowing through it rises very rapidly. Owing to the high current density existing at the contact point of print electrode 2 and metal layer 3 of the record carrier 4, the top-most metal layer melts and evaporates. For maintaining the current flow, an arc is formed between print electrode 2 and metal layer 3, burning out the metal layer at the position of the print electrode. Undue burn out is prevented as the print current, after ignition of the arc, is rapidly reduced to a fraction of the level necessary for ignition. In the circuit according to the invention this is achieved by power transistor T4 operating at a voltage, whose magnitude corresponds to the drop in potential occurring at the print electrode 2 for maintaining the arc. Thus, after the arc has been ignited, the difference between the emitter potential of transistor T4 and the anode potential of its series-connected diode D is no longer positive but O or negative. However, for conduction, this transistor requires a positive potential difference. As a result, the high partial current supplied by this transistor before ignition of the arc is eliminated after ignition. Instead, the reduced print current required for the further print process is supplied solely by transistor T3 which, because of its high negative emitter potential of −48 V, remains conductive even after the drop in potential at the print electrode. The magnitude of the print current subsequently flowing, which corresponds to the arc current, is limited by resistor R6. This current continues to flow until extinction of the arc after metal layer 3 has been completely burnt out or until the end of time interval T, when the potential of the circuit input 1 is again increased, switching off transistors T1 to T4. After the arc has been ignited, diode D prevents the inverse operation of transistor T4, which would otherwise occur if the potential of the print electrode were to drop further in the burnt-out process of the metal layer. The base current, supplied by transistor T2 to transistor T4 even in the switched off state, flows only in the presence of a diode D across the base emitter diode of transistor T4 to the minus pole of the operating voltage source U3. Transistor T4 may be replaced by a Darlington circuit. For rapidly switching off transistor T3 at the end of time interval T, it is also possible to use a diode. This diode, arranged between base and collector electrode, prevents transistor T3 from being driven into saturation.

FIG. 2 is a qualitative representation of the time curve of the print current I. The diagram shows that at the start of print interval T, the print current I, consisting of the partial currents flowing through transistors T3 and T4, very rapidly rises to a value I1 at which an arc is ignited. This current value I1 may be higher or lower, depending upon the thickness of the metal layer. After the arc has been ignited, the print current I drops very rapidly from value I1 to the reduced value I2 which is necessary for maintaining the arc. The very rapid reduction of the print current I to a fraction of its maximum value is made possible by the vary short time it takes to switch off the conductive diode D. Subsequently, after the metal layer 3 has been completely burnt out, the arc either extinguishes during the time interval T or the print current flow is stopped at the end of the maximum time interval T provided for printing by a drop in potential at input 1 of the circuit, causing all transistors to be switched off.

We claim:

1. A transistor circuit for switching print current in a metal paper printer having a print-electrode igniting an arc and for automatically reducing the print current after ignition of the arc, characterized in that two transistor power stages are connected to the print electrode and to operating voltage sources of different magnitude with the magnitude of the operating voltage of the second transistor power stage chosen such that the second transistor power stage, as a result of a drop in potential occurring at it upon ignition of the arc between the metal layer of the record carrier and the print electrode, no longer contributes to the print current.

2. Transistor circuit according to claim 1, characterized in that the collector of the second transistor power stage is connected to the print electrode through a diode (D) which after ignition of the arc prevents this transistor power stage from being inversely operated.

* * * * *